United States Patent
Chu et al.

(10) Patent No.: US 7,301,272 B2
(45) Date of Patent: Nov. 27, 2007

(54) LIGHTING DEVICE AND METHOD FOR MANUFACTURING THE SAME

(75) Inventors: Chang-Hsin Chu, Tan Tzu Hsiang (TW); Kuo-Hui Yu Chu, Hsin Kang Hsiang (TW); Shi-Ming Chen, Tainan (TW)

(73) Assignee: Epitech Technology Corporation, Tainan County (TW)

( * ) Notice: Subject to any disclaimer, the term of this patent is extended or adjusted under 35 U.S.C. 154(b) by 320 days.

(21) Appl. No.: 11/105,402

(22) Filed: Apr. 14, 2005

(65) Prior Publication Data

US 2006/0017372 A1    Jan. 26, 2006

(30) Foreign Application Priority Data

Jul. 21, 2004    (TW)    ............................... 93121797 A

(51) Int. Cl.
*H01J 1/62*    (2006.01)
(52) U.S. Cl. ...................................... 313/498; 313/506
(58) Field of Classification Search ................ 313/498, 313/499, 503, 506
See application file for complete search history.

(56) References Cited

U.S. PATENT DOCUMENTS 3,404,304 A * 10/1968 Bonin et al. ................. 313/499
6,462,469 B1 * 10/2002 Young ........................ 313/504

* cited by examiner

*Primary Examiner*—Vip Patel

(57) ABSTRACT

A lighting device and a method for manufacturing the same are described. First, a semiconductor layer of a first electrical property, an active layer and a semiconductor layer of a second electrical property are sequentially formed, and part of them are removed to form a mesa. A transparent contact layer is formed thereon, and thus forms a stack. Afterwards, a passivation layer is deposited on the stack and a first part of the semiconductor layer of the first electrical property adjacent to the stack. Part of the passivation layer is removed to expose part of the transparent contact layer. Then, an electrode of the second electrical property is formed on the exposed transparent contact layer. Afterwards, the electrode of the second electrical property is extended to the passivation layer on the first part of the semiconductor layer of the first electrical property to form a guard ring.

7 Claims, 6 Drawing Sheets

LIGHTING DEVICE AND METHOD FOR MANUFACTURING THE SAME

RELATED APPLICATIONS

The present application is based on, and claims priority from, Taiwan Application Serial Number 93121797, filed Jul. 21, 2004, the disclosure of which is hereby incorporated by reference herein in its entirety.

FIELD OF THE INVENTION

The present invention relates to a lighting device and a manufacturing method for the same, and more particularly, to a lighting device having electro-static discharge (ESD) protection and a manufacturing method for the same.

BACKGROUND OF THE INVENTION

Semiconductor light-emitting devices, such as light-emitting diodes (LED), are formed by using semiconductor materials. The semiconductor light-emitting devices are one kind of minute solid-state light sources that can transform electrical energy into light energy. The semiconductor light-emitting devices are not only small in volume, rapid in response speed, shockproof, long-lived, and use a low driving voltage, but also can meet the lightness, thinness, and miniaturization needs of various apparatuses, and thus have become very popular electric products in daily life.

However, unlike silicon ICs, almost no current LED chip incorporate ESD protection into the design thereof. Thus, the ESD performance is always not process-controllable, and subsequent processes, such as measurement or package, might damage the chip and lead to unexpected yield loss.

SUMMARY OF THE INVENTION

Hence, an objective of the present invention is to provide a lighting device with an electro-static discharge protection design and a manufacturing method for the same.

Another objective of the present invention is to provide a lighting device with a metal-insulator-semiconductor (MIS) structure forming a guard ring for the electro-static discharge protection, in which the guard ring can provide a conductive path for electro-static discharge pulses, and a manufacturing method for the same.

Still another objective of the present invention is to provide a lighting device and the manufacturing method, in which the electro-static discharge protection design is added in the process steps of conventional chips without increasing the process steps and the processing complexity.

According to the aforementioned objectives, the present invention provides a lighting device comprising a substrate, a semiconductor layer of a first electrical property, an active layer, a semiconductor layer of a second electrical property, a transparent contact layer, a passivation layer, an electrode of a second electrical property, and a guard ring. The semiconductor layer of the first electrical property is located on the substrate, in which the semiconductor layer of the first electrical property has a mesa. The active layer, the semiconductor layer of a second electrical property, and the transparent contact layer are orderly located on the mesa. The mesa of the semiconductor layer of the first electrical property, the active layer, the semiconductor layer of the second electrical property and the transparent contact layer form a stack structure. The passivation layer covers the stack structure and a first part of the semiconductor layer of the first electrical property adjacent to the stack structure, in which the passivation layer has a first opening to expose part of the transparent contact layer. The electrode of the second electrical property is located in the first opening and covers the part of the transparent contact layer. The guard ring extends from the electrode of the second electrical property to the passivation layer located on the first part of the semiconductor layer of the first electrical property. The guard ring surrounds the stack structure and has an opening. The guard ring, the passivation layer covered below, and the semiconductor layer of the first electrical property form a metal-insulator-semiconductor structure to supply the protection for the electro-static discharge.

According to the preferred embodiment of the present invention, the passivation layer further comprises a second opening to expose a second part of the semiconductor layer of the first electrical property, and further comprises an electrode of a first electrical property located in the second opening and covering the second part of the semiconductor layer of the first electrical property. The opening of the guard ring is close to the electrode of the first electrical property. The material of the substrate is, for example, sapphire. The material of the semiconductor layer of the first electrical property is, for example, n-type gallium nitride (GaN), and the material of the semiconductor layer of the second electrical property is, for example, p-type gallium nitride. The material of the passivation layer is selected from the group consisting of silicon dioxide ($SiO_2$) and silicon nitride ($Si_3N_4$). The material of the electrode of the second electrical property is selected from the group consisting of titanium/aurum (Ti/Au), nickel/aurum (Ni/Au), chromium/aurum (Cr/Au) and any arbitrary combination thereof. The lighting device is a gallium nitride light-emitting diode or a p-type-intrinsic-n-type (P-I-N) light-emitting diode.

According to the aforementioned objectives, the present invention provides a method for manufacturing a lighting device comprising the following steps. First, a semiconductor layer of a first electrical property is formed on a substrate. Then, an active layer is formed on the semiconductor layer of the first electrical property. Then, a semiconductor layer of a second electrical property is formed on the active layer. Then, part of the semiconductor layer of the first electrical property, part of the active layer, and part of the semiconductor layer of the second electrical property are removed to form a mesa. A transparent contact layer is then formed on the mesa, in which the semiconductor layer of the first electrical property, the active layer, the semiconductor layer of the second electrical property and the transparent contact layer on the mesa form a stack structure. Then, a passivation layer is formed covering the stack structure and a first part of the semiconductor layer of the first electrical property adjacent to the stack structure. Then, part of the passivation layer is removed to expose part of the transparent contact layer, and an electrode of the second electrical property is formed on the exposed part of the transparent contact layer and another part of the passivation layer. Then, the electrode of the second electrical property is extended to the passivation layer located on the first part of the semiconductor layer of the first electrical property to form a guard ring, which has an opening.

According to the preferred embodiment of the present invention, the step of removing part of the semiconductor layer of the first electrical property, part of the active layer, and part of the semiconductor layer of the second electrical property is performed by using an inductively coupled plasma (ICP) etching. The present invention further comprises removing part of the passivation layer to expose a second part of the semiconductor layer of the first electrical property after the step of forming the passivation layer covering the stack structure and the first part of the semiconductor layer of the first electrical property adjacent to the stack structure. Then, an electrode of a first electrical property is formed on the second part of the semiconductor layer of the first electrical property. The opening of the guard ring is close to the electrode of the first electrical property. The material of the substrate is, for example, sapphire. The material of the semiconductor layer of the first electrical property is, for example, n-type gallium nitride, and the material of the semiconductor layer of the second electrical property is, for example, p-type gallium nitride. The material of the passivation layer is selected from the group consisting of silicon dioxide and silicon nitride. The material of the electrode of the second electrical property is selected from the group consisting of titanium/aurum, nickel/aurum, chromium/aurum and any arbitrary combination thereof. The lighting device is a gallium nitride light-emitting diode or a p-type-intrinsic-n-type light-emitting diode.

According to the aforementioned objectives, the present invention provides an electro-static discharge protection structure suitable in a lighting device. The lighting device has an epitaxial structure comprising a semiconductor layer of a first electrical property, an active layer, a semiconductor layer of a second electrical property, a transparent contact layer, a passivation layer and a semiconductor layer of a second electrical property sequentially formed. The electro-static discharge protection structure comprises a semiconductor layer, an insulator layer located on the semiconductor layer, and a metal layer located on the insulator layer. The semiconductor layer is electrically connected to the semiconductor layer of the first electrical property, and the insulator layer is electrically connected to the passivation layer. The metal layer, having an opening, surrounds the epitaxial structure. The material of the semiconductor layer is identical to the material of the semiconductor layer of the first electrical property, and the material of the insulator layer is identical to the material of the passivation layer, and the material of the metal layer is identical to the material of the electrode of the second electrical property.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 2a' to FIG. 2e' illustrate the process steps of the lighting device of the preferred embodiment of the present invention along the hatches B-B'.

DETAILED DESCRIPTION OF THE PREFERRED EMBODIMENT

In order to make clear the display unit of a micro electro mechanical system provided by the present invention, the structure of the transmissible display units disclosed in the present invention is described in detail in the preferred embodiments.

The present invention discloses a lighting device having an electro-static discharge protection structure connected in parallel to the lighting device. The electro-static discharge protection structure provides a conductive path for electro-static discharge pulses produced by lighting devices. Without any increase of process step, the electro-static discharge protection structure can be embedded into individual lighting device chips. In order to make the illustration of the present invention more explicit and complete, the following description is stated with reference to FIG. 1, FIG. 2a to FIG. 2e, and FIG. 2a' to FIG. 2e'.

Figure 1:
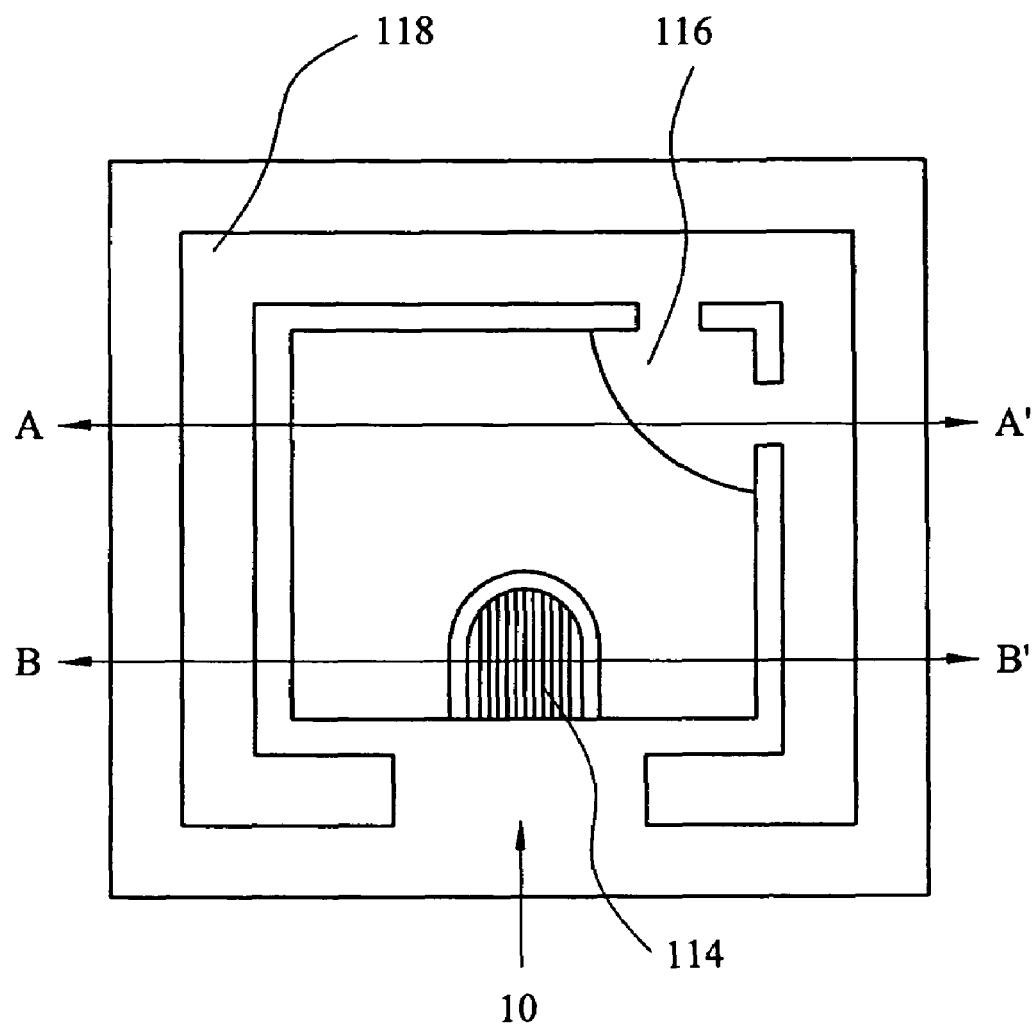
FIG. 1 is a top view of the lighting device according to the preferred embodiment of the present invention.

Reference is made to FIG. 1, which is a top view of the lighting device according to the preferred embodiment of the present invention. The lighting device of the preferred embodiment of the present invention is, for example, a p-type-intrinsic-n-type (P-I-N) light-emitting diode. In FIG. 1, the lighting device of the present invention has a guard ring 118 surrounding the lighting device and electrically connected to the electrode of a second electrical property 116 of the lighting device. The guard ring 118 has an opening 10 close to the electrode of a first electrical property 114 of the lighting device.

Figure 2A:
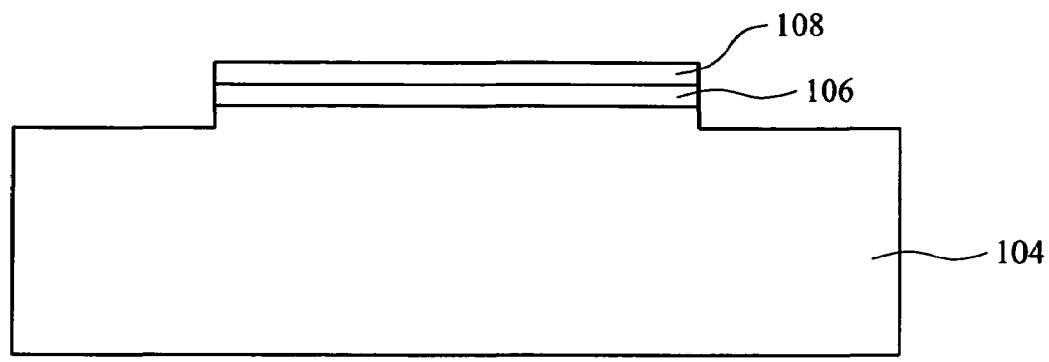
FIG. 2a to FIG. 2e illustrate the process steps of the lighting device of the preferred embodiment of the present invention along the hatches A-A'.
Figure 2A:
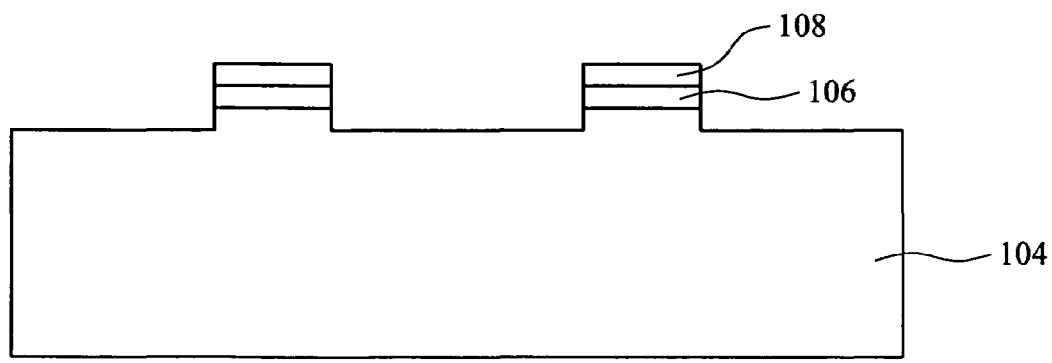
Figure 2B:
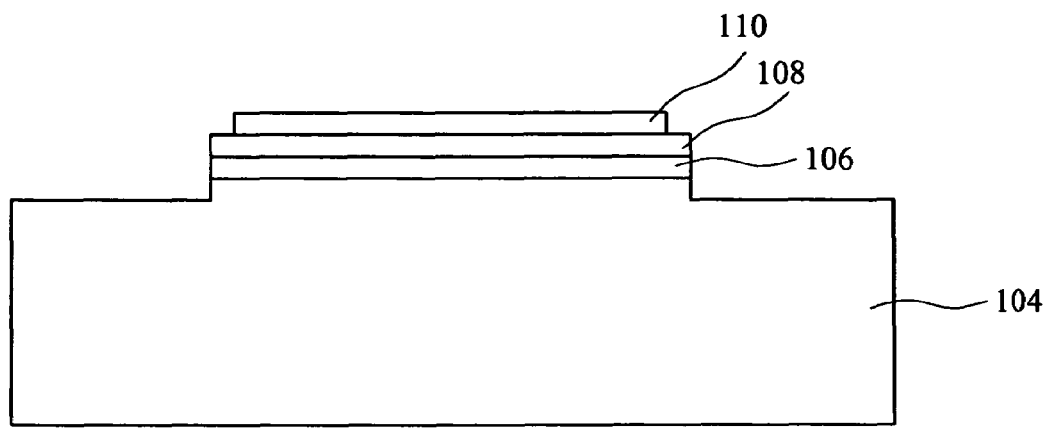
Figure 2B:
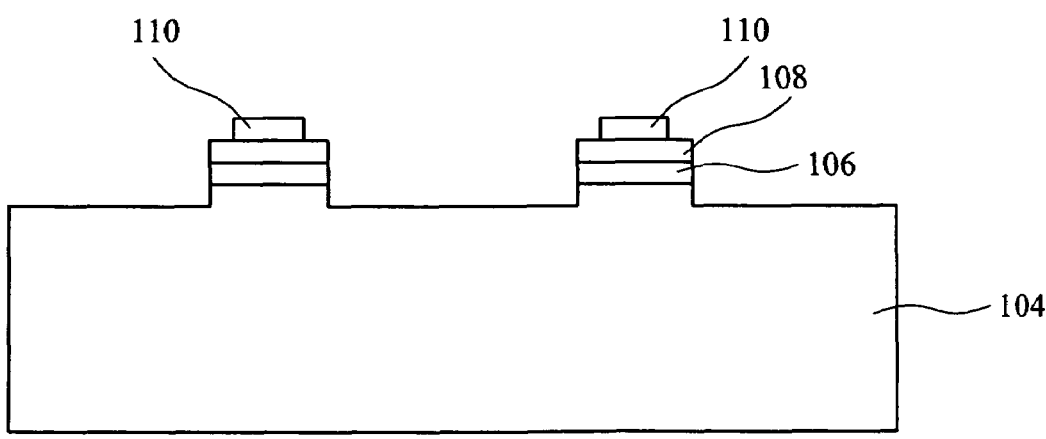
Figure 2C:
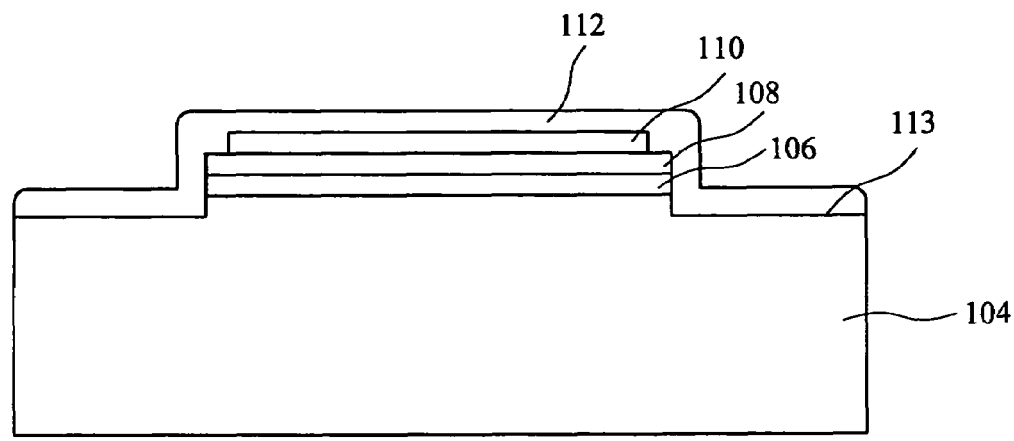
Figure 2C:
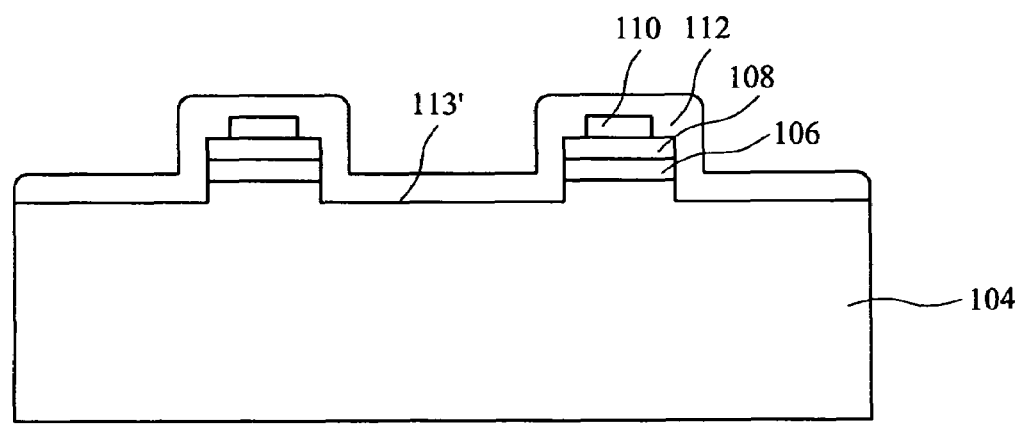
Figure 2D:
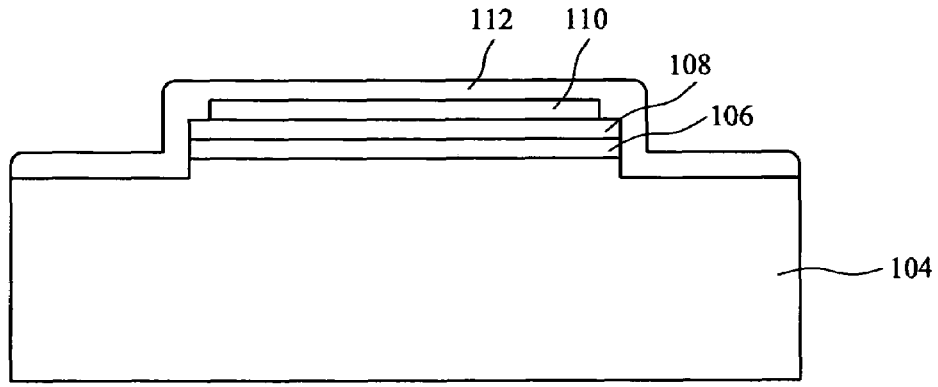
Figure 2D:
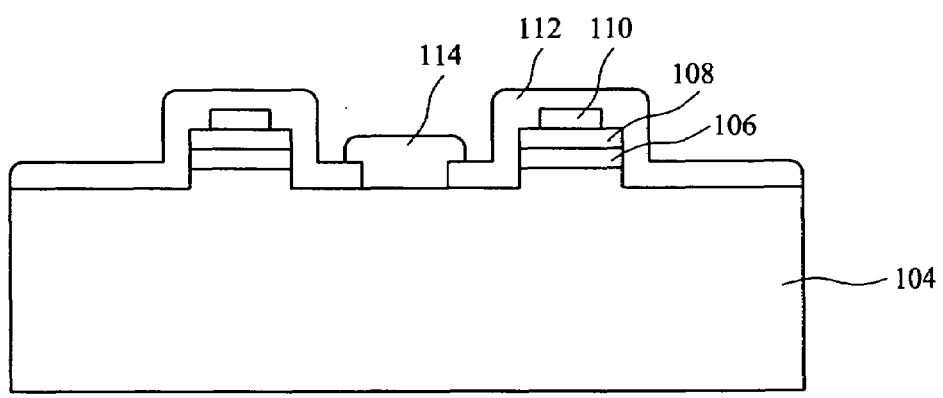
Figure 2E:
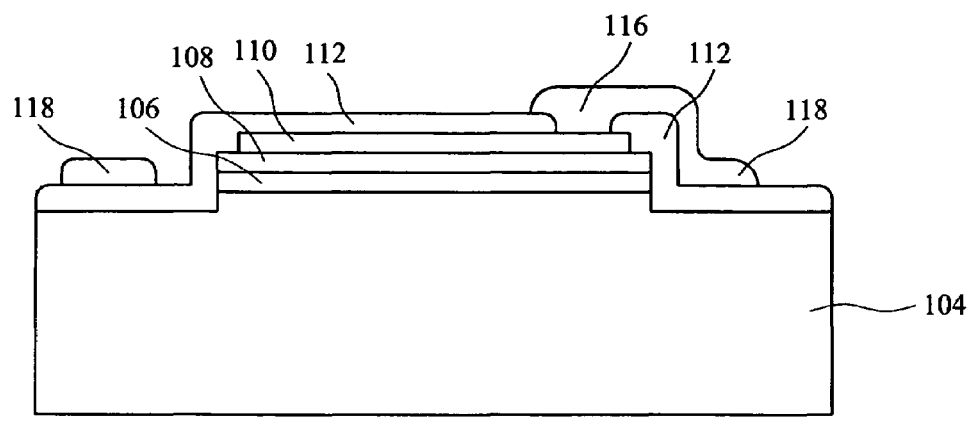
Figure 2E:
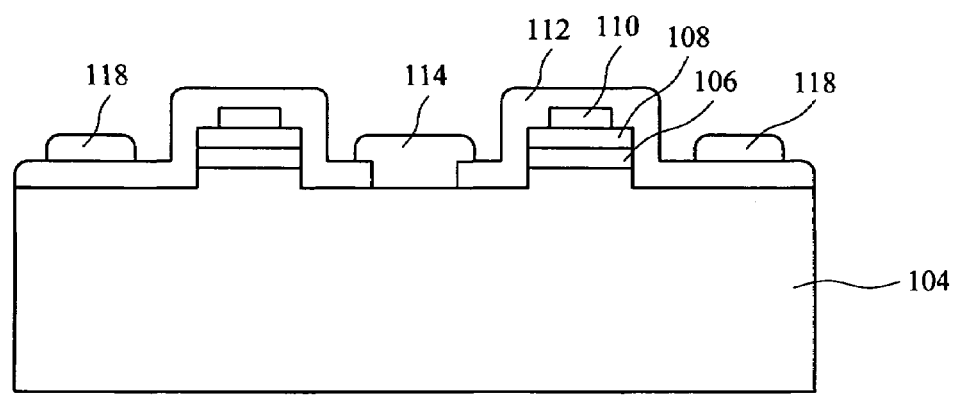

Then, reference is made to FIG. 2a to FIG. 2e and FIG. 2a' to FIG. 2e' illustrating the process steps of the lighting device of the preferred embodiment of the present invention along the hatches A-A' and B-B', respectively. First, a substrate (not shown in the drawings) is applied. The material of the substrate is, for example, sapphire. Then, a semiconductor layer of a first electrical property 104 is formed on the substrate. Afterwards, an active layer 106 is formed on the semiconductor layer of the first electrical property 104. Then, a semiconductor layer of a second electrical property 108 is formed on the active layer 106. The material of the semiconductor layer of the first electrical property 104 is, for example, n-type gallium nitride, and the material of the semiconductor layer of the second electrical property 108 is, for example, p-type gallium nitride. The first electrical property and the second electrical property hereinafter are opposite to each other. Then, part of the semiconductor layer of the first electrical property 104, part of the active layer 106, and part of the semiconductor layer of the second electrical property 108 are removed to form a mesa. The removing step is by using an inductively coupled plasma etching.

In FIG. 2b and FIG. 2b', a transparent contact layer 110 is formed on the mesa, in which the semiconductor layer of the first electrical property 104, the active layer 106, the semiconductor layer of the second electrical property 108 and the transparent contact layer 110 on the mesa form a stack structure. Then, a passivation layer 112 is deposited as an insulator layer covering the stack structure, a first part 113 (FIG. 2c) of the semiconductor layer of the first electrical property 104 adjacent to the stack structure and a second part 113' (FIG. 2c') of the semiconductor layer of the first electrical property 104 adjacent to the stack structure. The material of the passivation layer 112 is selected from the group consisting of silicon dioxide and silicon nitride.

In FIG. 2d, part of the passivation layer 112 is removed to expose the second part 113' of the semiconductor layer of the first electrical property 104, and then, an electrode of the first electrical property 114 is formed thereon.

Then, in FIG. 2d', part of the passivation layer 112 is removed to expose part of the transparent contact layer 110. Then, an electrode of the second electrical property 116 is formed on the exposed part of the transparent contact layer 110 and another part of the passivation layer 112. The material of the electrode of the second electrical property 116 is selected from the group consisting of titanium/aurum, nickel/aurum, chromium/aurum and any arbitrary combination thereof. Then, the electrode of the second electrical property 116 is extended to the passivation layer 112 located on the first part 113 of the semiconductor layer of the first electrical property 104 to form a guard ring 118.

From FIG. 2e, the guard ring 118 of the lighting device of the present invention is a metal-insulator-semiconductor structure. The metal-insulator-semiconductor structure can provide a conductive path for electro-static discharge pulses during electro-static discharging to protect the chips of the lighting devices. Additionally, the guard ring 118 can be produced simultaneously with forming of the electrode of the second electrical property 116. Thus, the guard ring 118 of the present invention can be manufactured without any increase in process steps.

As shown in FIG. 2e, the electrode of the second electrical property 116 and the semiconductor layer of the first electrical property 104 are used jointly in the metal-insulator-semiconductor structure of the guard ring 118 and the lighting device. That is, it is a parallel-connected structure that both ends of the elements are connected together. Therefore, the guard ring 118 of the lighting device of the present invention and the lighting device are connected in parallel. With forward bias, the path of the forward current of the lighting device is the electrode of the second electrical property 116→the transparent contact layer 110→the semiconductor layer of the second electrical property 108→the active layer 106→the semiconductor layer of the first electrical property 104. As for the path of the forward current of the guard ring 118, since most part of the current goes through the lighting device and the insulator layer in the metal-insulator-semiconductor structure of the guard ring 118 prohibits most part of the current, the guard ring 118 is off. Accordingly, since the lighting device is on, the problem of the electro-static discharge is not serious for forward bias.

With reverse bias, the reverse resistance of the lighting device becomes bigger, so the current is blocked. However, the reverse current is large enough to penetrate through the insulator layer in the metal-insulator-semiconductor structure of the guard ring 118 (with the proper design for the thickness of the insulator layer). Hence, most of the reverse current will go through the guard ring 118. Thus, the metal-insulator-semiconductor structure of the guard ring 118 will supply the protection for the electro-static discharge. By adjusting the thickness of the passivation layer 112 and the size of the metal-insulator-semiconductor structure of the guard ring 118, the I-V characteristic of the guard ring 118 can be controlled to meet the requirement for the protection for the electro-static discharge. From the above, the rectification of the metal-insulator-semiconductor structure of the guard ring 118 will not affect the forward current of the lighting device during forward bias, but during reverse bias, the metal-insulator-semiconductor structure of the guard ring 118 needs to be effective before the lighting device becomes on to protect the chip.

Using the presented processing steps, we can achieve about 84% yield, which survives −1000V HBM ESD pulses (three times). Originally, the chips without MIS guard ring can only survive below −300V HBM ESD pulse. We further test the chip using −4000V ESD pulses, we found the MIS guard ring was damaged prior to the lighting area. This phenomenon gives an evidence of that the MIS guard ring structure actually provides a conductive path for ESD pulse, protecting the lighting area, till the insulator breakdowns.

From the above preferred embodiment of the present invention, the advantages of the present invention can be seen. First, the guard ring of the lighting device of the present invention has a metal-insulator-semiconductor structure, which can be used as the protection for the electro-static discharge. Then, the guard ring of the lighting device of the present invention can be produced simultaneously with the forming of the electrode of the second electrical property, and thus the process steps and the processing complexity will not be increased.

As is understood by a person skilled in the art, the foregoing preferred embodiments of the present invention are illustrative of the present invention rather than limiting of the present invention. It is intended that various modifications and similar arrangements are covered within the spirit and scope of the appended claims, the scope of which should be accorded the broadest interpretation so as to encompass all such modifications and similar structures

What is claimed is:

1. A lighting device, comprising:
   a substrate;
   a semiconductor layer of a first electrical property, located on the substrate, wherein the semiconductor layer of the first electrical property has a mesa;
   an active layer, located on the mesa of the semiconductor layer of the first electrical property;
   a semiconductor layer of a second electrical property, located on the active layer;
   a transparent contact layer, located on the semiconductor layer of the second electrical property, wherein the mesa of the semiconductor layer of the first electrical property, the active layer, the semiconductor layer of the second electrical property and the transparent contact layer form a stack structure;
   a passivation layer, covering the stack structure and a first part of the semiconductor layer of the first electrical property adjacent to the stack structure, wherein the passivation layer has a first opening to expose part of the transparent contact layer;
   an electrode of a second electrical property, located in the first opening and covering the part of the transparent contact layer; and
   a guard ring, wherein the guard ring extends from the electrode of the second electrical property to the passivation layer located on the first part of the semiconductor layer of the first electrical property and has an opening.

2. The lighting device of claim 1, wherein the passivation layer has a second opening to expose a second part of the semiconductor layer of the first electrical property.

3. The lighting device of claim 2, further comprising an electrode of a first electrical property located in the second opening and covering the second part of the semiconductor layer of the first electrical property.

4. The lighting device of claim 3, wherein the opening is close to the electrode of the first electrical property.

5. The lighting device of claim 1, wherein the guard ring surrounds the stack structure.

6. The lighting device of claim 1, wherein a material of the semiconductor layer of the first electrical property is n-type gallium nitride (GaN), and a material of the semiconductor layer of the second electrical property is p-type gallium nitride.

7. The lighting device of claim 1, wherein the lighting device is a gallium nitride light-emitting diode or a p-type-intrinsic-n-type (P-I-N) light-emitting diode.

* * * * *